United States Patent
Sasaki et al.

(10) Patent No.: US 8,872,514 B2
(45) Date of Patent: Oct. 28, 2014

(54) MAGNETIC SENSOR, MAGNETIC DETECTOR, AND MAGNETIC HEAD

(75) Inventors: Tomoyuki Sasaki, Tokyo (JP); Tohru Oikawa, Tokyo (JP); Kiyoshi Noguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 439 days.

(21) Appl. No.: 13/017,707

(22) Filed: Jan. 31, 2011

(65) Prior Publication Data

US 2011/0204886 A1    Aug. 25, 2011

(30) Foreign Application Priority Data

Feb. 23, 2010    (JP) ................................. 2010-037362

(51) Int. Cl.

| G01R 33/02 | (2006.01) |
|---|---|
| G11B 5/33 | (2006.01) |
| G01R 33/09 | (2006.01) |
| B82Y 25/00 | (2011.01) |
| G01R 33/12 | (2006.01) |

(52) U.S. Cl.
CPC .......... *G01R 33/1284* (2013.01); *G01R 33/093* (2013.01); *B82Y 25/00* (2013.01)
USPC .......... 324/244; 324/246; 324/249; 324/71.1; 360/313; 360/319; 360/321; 360/328

(58) Field of Classification Search
USPC .......... 360/319, 313, 321, 328; 324/244, 246, 324/249
See application file for complete search history.

(56) References Cited

U.S. PATENT DOCUMENTS

| 3,629,697 | A | * | 12/1971 | Bouchiat et al. ............... 324/301 |
|---|---|---|---|---|
| 4,931,759 | A | * | 6/1990 | Breneman et al. ............ 335/301 |
| 5,557,492 | A | * | 9/1996 | Gill et al. ....................... 360/319 |
| 6,034,847 | A | * | 3/2000 | Komuro et al. ............ 360/125.5 |
| 6,061,211 | A | * | 5/2000 | Yoda et al. ................ 360/324.12 |
| 6,430,010 | B1 | * | 8/2002 | Murdock ....................... 360/319 |
| 6,665,152 | B2 | | 12/2003 | Nemoto |
| 6,704,178 | B2 | * | 3/2004 | Nakashio et al. .......... 360/324.2 |
| 6,850,393 | B2 | * | 2/2005 | Hara et al. ..................... 360/321 |
| 6,930,862 | B2 | * | 8/2005 | Gill et al. ....................... 360/313 |
| 7,064,649 | B2 | | 6/2006 | Schmollngruber et al. |
| 7,140,094 | B2 | | 11/2006 | Nemoto |

(Continued)

FOREIGN PATENT DOCUMENTS

| CN | 101359475 A | 2/2009 |
|---|---|---|
| JP | A-H7-296340 | 11/1995 |

(Continued)

OTHER PUBLICATIONS

T. Sasaki et al., "Temperature dependerce of spin diffusion length in silicon by Hanle-type spin precession", *Applied Physics Letters*, vol. 96, pp. 122101-1 to 12101-3, 2010.

(Continued)

*Primary Examiner* — Jermele M Hollington
*Assistant Examiner* — Christopher McAndrew
(74) *Attorney, Agent, or Firm* — Oliff PLC

(57) ABSTRACT

A magnetic sensor comprises a first ferromagnetic body, a second ferromagnetic body, a channel extending from the first ferromagnetic body to the second ferromagnetic body, a magnetic shield covering the channel, and an insulating film disposed between the channel and the magnetic shield, while the magnetic shield has a through-hole extending toward the channel.

21 Claims, 15 Drawing Sheets

(56) References Cited

U.S. PATENT DOCUMENTS

| | | | |
|---|---|---|---|
| 7,262,940 B2* | 8/2007 | Iwakura et al. | 360/317 |
| 7,280,322 B2* | 10/2007 | Takahashi et al. | 360/324.1 |
| 7,463,459 B2* | 12/2008 | Ding et al. | 360/324.12 |
| 7,534,626 B2* | 5/2009 | Parkin | 438/3 |
| 7,548,400 B2* | 6/2009 | Kagami et al. | 360/324.12 |
| 7,755,929 B2* | 7/2010 | Inomata et al. | 365/158 |
| 8,072,713 B2 | 12/2011 | Yamada et al. | |
| 2002/0051380 A1* | 5/2002 | Kamiguchi et al. | 365/158 |
| 2003/0123198 A1 | 7/2003 | Sugawara et al. | |
| 2004/0228041 A1* | 11/2004 | Iwakura et al. | 360/317 |
| 2005/0111138 A1* | 5/2005 | Yamakawa et al. | 360/126 |
| 2007/0230063 A1* | 10/2007 | Seagle | 360/319 |
| 2007/0253116 A1* | 11/2007 | Takahashi | 360/313 |
| 2009/0034131 A1* | 2/2009 | Yamada et al. | 360/319 |
| 2009/0080120 A1* | 3/2009 | Funayama et al. | 360/319 |
| 2009/0141407 A1* | 6/2009 | Lee et al. | 360/319 |
| 2009/0243594 A1* | 10/2009 | Kahlman | 324/202 |

FOREIGN PATENT DOCUMENTS

| | | |
|---|---|---|
| JP | A-2002-298312 | 10/2002 |
| JP | A-2003-008105 | 1/2003 |
| JP | A-2003-069109 | 3/2003 |
| JP | A-2004-521513 | 7/2004 |
| JP | A-2007-299467 | 11/2007 |
| JP | A-2009-037702 | 2/2009 |

OTHER PUBLICATIONS

T. Sasaki et al., "Evidence of Electrical Spin Injection Into Silicon Using MgO Tunnel Barrier", *IEEE Transactions on Magnetics*, vol. 46, No. 6, pp. 1436-1439, Jun. 2010.

Search Report issued in European Patent Application No. 11153123.2 dated Apr. 15, 2011.

O.M.J. van't Erve et al. "Electrical injection and detection of spin-polarized carriers in silicon in a lateral transport geometry", Applied Physics Letters, U.S., vol. 91, Nov. 21, 2007, p. 212109-01-p. 212109-03.

M. Furis et al. "Local Hanle-effect studies of spin drift and diffusion in n: GaAs epilayers and spin-transport devices", New Journal of Physics, vol. 347, Sep. 28, 2007, p. 1-p. 18.

* cited by examiner

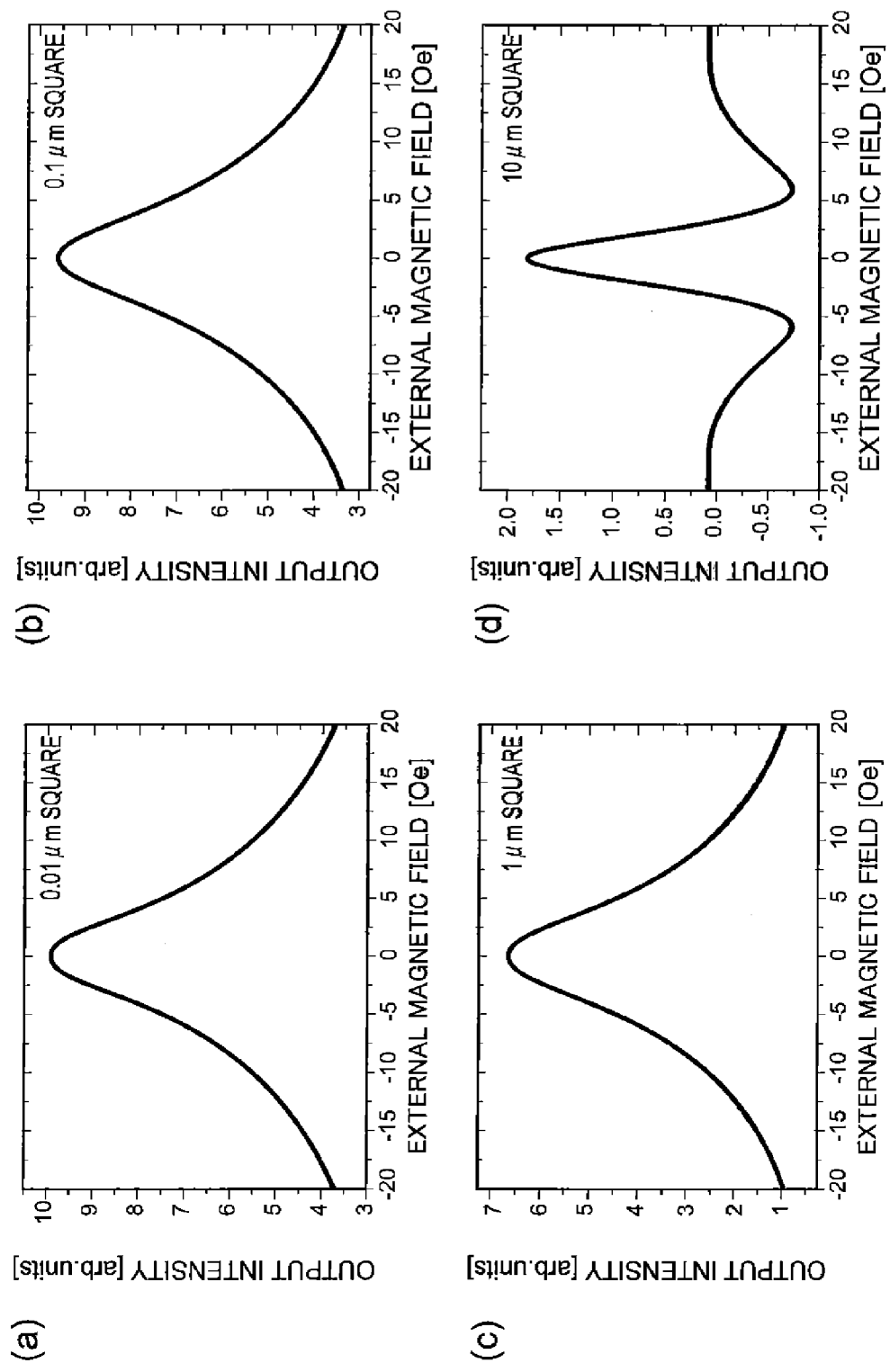

MAGNETIC SENSOR, MAGNETIC DETECTOR, AND MAGNETIC HEAD

BACKGROUND OF THE INVENTION

1. Field of the Invention

The present invention relates to a magnetic sensor, a magnetic detector, and a magnetic head.

2. Related Background Art

Various devices for detecting external magnetic fields have conventionally been known, examples of which include Hall effect devices, MI (Magneto Impedance) devices, MR (Magneto Resistive) devices, GMR (Giant Magneto Resistive) devices, TMR (Tunnel Magneto Resistive) devices, and spin accumulation devices (see Japanese Patent Application Laid-Open No. 2007-299467). Magnetic field detection devices of this type have been in use for HDD heads for detecting magnetic fields from minute areas, sensors for detecting the geomagnetic field, and the like.

SUMMARY OF THE INVENTION

For detecting magnetic fluxes from a smaller area, the magnetic field detection devices used for the HDD heads have been made finer. However, techniques for finely dividing the devices have been approaching their limits. On the other hand, finely dividing the devices has increased the device resistance, thereby hindering lower power consumption and higher speed operation. That is, there has been a trade-off between making magnetic fluxes from minute areas detectable and inhibiting the device resistance from increasing.

For solving the problem mentioned above, it is an object of the present invention to provide a magnetic sensor which can detect magnetic fluxes from minute areas and inhibit the device resistance from increasing.

For achieving the above-mentioned object, the magnetic sensor in accordance with the present invention comprises a first ferromagnetic body, a second ferromagnetic body, a channel extending from the first ferromagnetic body to the second ferromagnetic body, a magnetic shield covering the channel, and an insulating film disposed between the channel and the magnetic shield, wherein the magnetic shield has a through-hole extending toward the channel.

One of the first and second ferromagnetic bodies functions as an injecting electrode for injecting spins into the channel, while the other functions as a receiving electrode for receiving the spins from the channel. The channel functions as a part transmitting therethrough the spins injected from the first or second ferromagnetic body. In this magnetic sensor, the magnetic shield covering the channel is provided with a through-hole extending toward the channel. When an external magnetic field is applied to the channel through the through-hole, the spins transmitted through the channel rotate their direction about the axis of the applied magnetic field, thereby diffusing while rotating (so-called Hanle effect). When no external magnetic field is applied to the channel, on the other hand, the spins within the channel diffuse as they are without changing their direction. Therefore, from a voltage output or resistance output read from the receiving electrode in response to the external magnetic field, a value corresponding to the degree of rotation of spins depending on whether the external magnetic field exists or not can be detected. Hence, magnetic fluxes can be detected from a minute area corresponding to the size of the above-mentioned through-hole. Here, the magnetic fluxes can be detected without making the sizes of the first and second ferromagnetic bodies smaller, whereby the device resistance can be inhibited from being increased by finely dividing the first and second ferromagnetic bodies.

Preferably, an axial direction of the through-hole is nonparallel to a direction of magnetization of the first and second ferromagnetic bodies.

When an external magnetic field is applied to the channel through the through-hole, spins within the channel rotate their direction about the axis of the applied magnetic field as mentioned above. If the axial direction of the through-hole and the direction of magnetization of the first and second ferromagnetic bodies are parallel to each other, the spins will not rotate their direction in response to the external magnetic flux applied thereto, thus making it hard to detect magnetic fluxes. Hence, such magnetic fluxes can favorably be detected when the axial direction of the through-hole is nonparallel to the directions of magnetization of the first and second ferromagnetic bodies.

Preferably, the through-hole has a whole cross section opposing the channel as seen from the axial direction of the through-hole. In this case, external magnetic fields can be read more accurately from desirable areas.

The through-hole may have a bottom part having a diameter smaller than that of a top part thereof. That is, the through-hole may have a tapered side face. In this case, magnetic fluxes caused by external magnetic fields cannot be absorbed by the magnetic shield when obliquely incident on the channel. Therefore, the angle of incidence of external magnetic fields can be changed according to the taper angle of the tapered side face.

Preferably, the channel has a bent form, and the through-hole is disposed so as to oppose an outer side face of a bend of the channel. In this case, an area for reading magnetic fluxes of external magnetic fields and the like can be made compact.

Preferably, the first and second ferromagnetic bodies are embedded in the channel, an upper face of the first and second ferromagnetic bodies and an upper face of the insulating film form a flat surface, and the magnetic shield provided with the through-hole covers the flat surface.

When the magnetic shield provided with the through-hole covers the flat surface formed by the upper faces of the first and second ferromagnetic bodies and insulating film as such, it can be arranged parallel to a magnetic-field-forming surface of a recording medium and the like. In this case, magnetic fields can be read smoothly.

Preferably, a part located on the through-hole side of the channel has a width narrower than that of each of respective parts located on the first ferromagnetic body side and second ferromagnetic body side of the channel.

When the part of the channel located under the through-hole has a narrowed form as such, spin flows diffusing into the channel can be concentrated at this narrow part. Therefore, external magnetic fields can effectively be applied to the concentrated spins from the through-hole. Hence, the output sensitivity of magnetic fields can be improved.

Preferably, the direction of magnetization of at least one of the first and second ferromagnetic bodies is pinned by at least one of an antiferromagnetic body and shape anisotropy.

When at least one of the first and second ferromagnetic bodies is exchange-coupled with an antiferromagnetic body, the direction of magnetization of at least one of the first and second ferromagnetic bodies can be provided with unidirectional anisotropy. This can yield the first or second ferromagnetic body having a higher coercive force in one direction than when no antiferromagnetic body is provided. Pinning the magnetization by shape anisotropy can eliminate an antiferromagnetic body for yielding a coercive force difference.

Preferably, the direction of magnetization of the first ferromagnetic body is the same as that of the second ferromagnetic body. This makes it easier to pin the magnetization of the first and second ferromagnetic bodies.

Preferably, the magnetic sensor further comprises a permanent magnet for supplying the through-hole with a magnetic field oriented in the axial direction of the through-hole. In the case where no magnetic field is applied to a channel layer by the permanent magnet, an output peak appears when the external magnetic field to be inspected is zero. When the magnetic field is applied to the channel layer by the permanent magnet, by contrast, the output peak position can be shifted, so that an output peak can be generated when the external magnetic field is not zero.

Preferably, the first and second ferromagnetic bodies are made of a metal selected from the group consisting of Cr, Mn, Co, Fe, and Ni, an alloy containing at least one element selected from the group, or a compound containing at least one element selected from the group and at least one element selected from the group consisting of B, C, N, Si, and Ge. They are ferromagnetic materials with high spin polarizability and thus can favorably achieve a function as a spin-injecting or spin-receiving electrode.

Preferably, the channel is made of a semiconductor containing at least one of Si, Ge, GaAs, C, and ZnO. Such a semiconductor has a relatively large spin-diffusion length, whereby spins can favorably be accumulated within the channel.

Preferably, a barrier layer is formed between at least one of the first and second ferromagnetic bodies and the channel. This makes it possible for a large number of spin-polarized electrons to be injected from at least one of the first and second ferromagnetic bodies into the channel, whereby the potential output of the magnetic sensor can be enhanced.

Preferably, the magnetic sensor further comprises first and second reference electrodes, the channel extends from the first ferromagnetic body to the first reference electrode in a direction different from a direction extending from the first ferromagnetic body to the second ferromagnetic body, and the channel extends from the second ferromagnetic body to the second reference electrode in a direction different from a direction extending from the second ferromagnetic body to the first ferromagnetic body. For example, this makes it possible to connect the first ferromagnetic body and the first reference electrode to a current supply, and the second ferromagnetic body and the second reference electrode to an output meter.

Preferably, in the above-mentioned structure, the magnetic sensor further comprises a current supply and an output meter, one of the current supply and output meter is electrically connected to the first ferromagnetic body and the first reference electrode, and the other is electrically connected to the second ferromagnetic body and the second reference electrode. By connecting the first ferromagnetic body and the first reference electrode to the current supply, for example, it allows a detection current to flow through the first ferromagnetic body. Since a current flows from the first ferromagnetic body that is a ferromagnetic body to a nonmagnetic channel, a spin having a direction corresponding to the direction of magnetization of the first ferromagnetic body can be injected into the channel. By connecting the second ferromagnetic body and the second reference electrode to the output meter, on the other hand, it can read an output corresponding to an external magnetic field.

Preferably, the magnetic sensor further comprises a power supply disposed between the first and second ferromagnetic bodies without using the first and second reference electrodes. Between the first and second ferromagnetic bodies, the resistance is also changed by a magnetoresistive effect occurring according to whether an external magnetic field is applied or not. Therefore, providing a power supply between the first and second ferromagnetic bodies without the first and second reference electrodes and monitoring a change in current or voltage can detect the external magnetic field.

Preferably, a magnetic detector comprises a plurality of such magnetic sensors. In this case, respective outputs of the magnetic sensors can be combined. Such a magnetic detector can be employed in a biosensor for detecting cancer cells and the like, for example.

A magnetic head may comprise a reading head part having the above-mentioned magnetic sensor and a recording head part for writing. This can provide a new magnetic head utilizing the so-called Hanle effect.

The present invention can provide a magnetic sensor which can detect magnetic fluxes from minute areas and inhibit the device resistance from increasing.

BRIEF DESCRIPTION OF THE DRAWINGS

FIG. 15 is a graph illustrating results of simulation representing differences in output intensity caused by differences in size of a through-hole.

DESCRIPTION OF THE PREFERRED EMBODIMENTS

Figure 1:
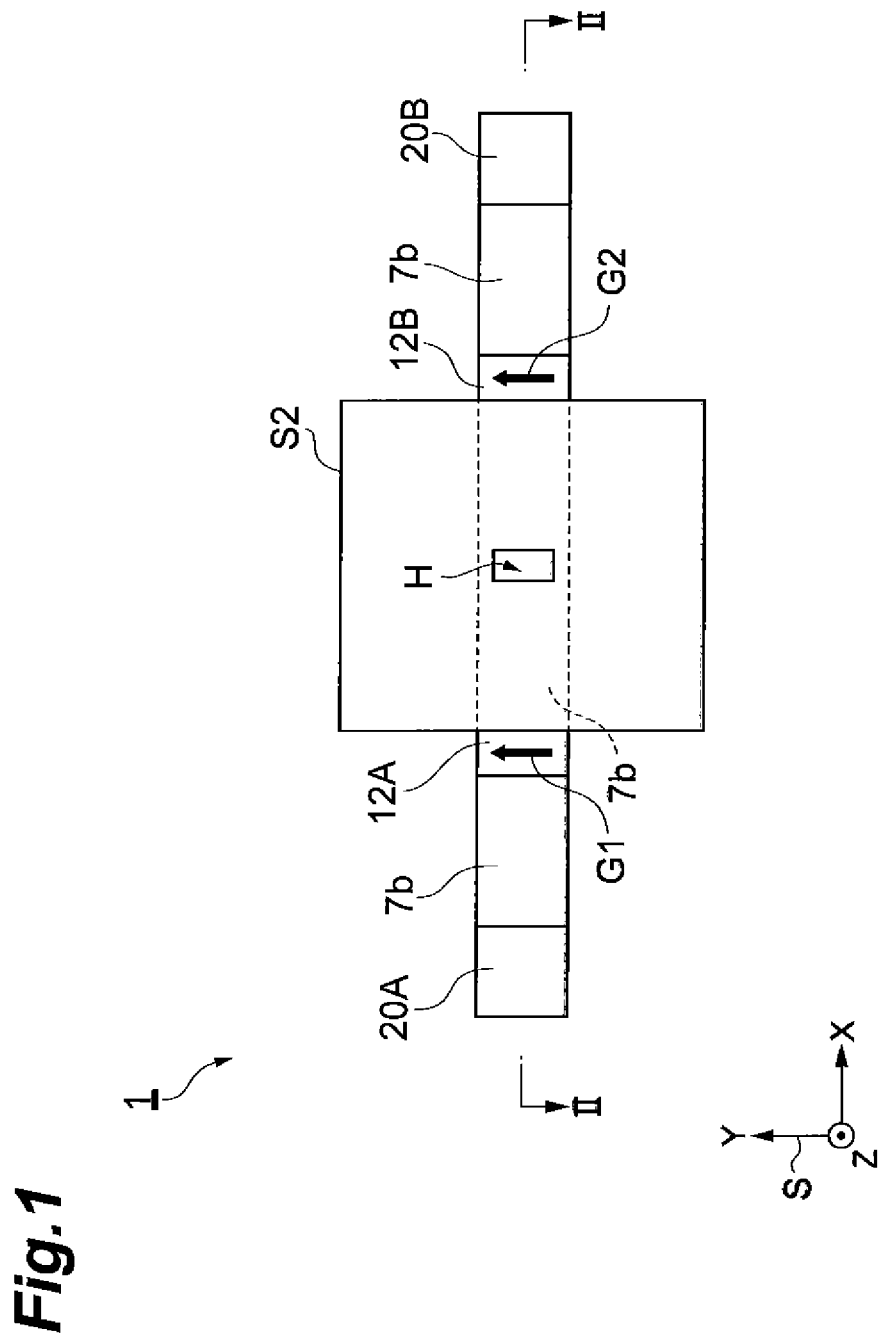
FIG. 1 is a top plan view of a magnetic sensor.

In the following, preferred embodiments of the magnetic sensor in accordance with the present invention will be explained in detail with reference to the drawings. An XYZ orthogonal coordination system is illustrated in the drawings.

First Embodiment

Figure 2:
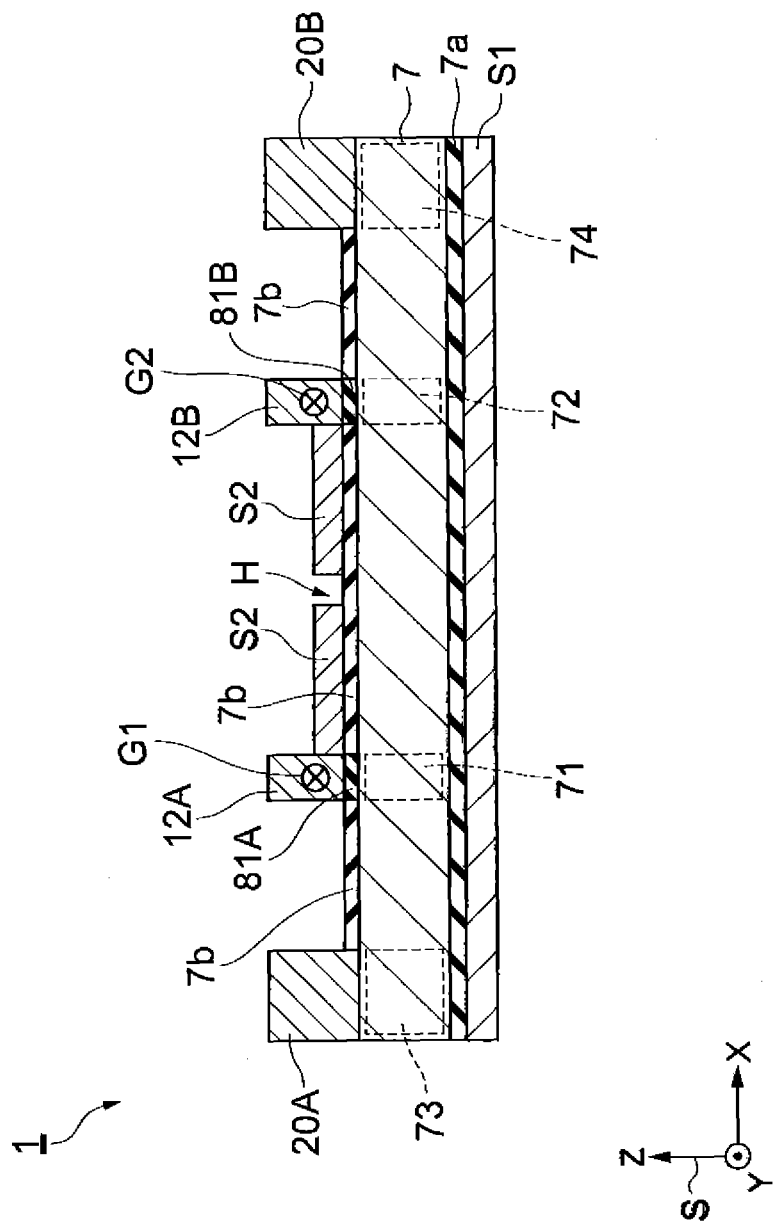
FIG. 2 is a sectional view taken along the line of FIG. 1.

FIG. 1 is a top plan view of the magnetic sensor in accordance with the first embodiment. FIG. 2 is a sectional view taken along the line II-II of FIG. 1.

As illustrated in FIG. 2, a magnetic sensor 1 comprises a channel layer 7, a first ferromagnetic layer 12A, a second ferromagnetic layer 12B, and a magnetic shield layer and detects external magnetic fields along the Z axis.

As illustrated in FIG. 1, the channel layer 7 extends from the first ferromagnetic layer 12A to the second ferromagnetic layer 12B and has a rectangular form as seen from the thickness direction of the channel layer 7. The channel layer 7 may be doped with ions for rendering it electrically conductive. The ion content may be $1.0\times10^{15}$ to $1.0\times10^{22}$ cm$^{-3}$, for example. Preferably, the channel layer 7 is made of a material having a long spin life, an example of which is a semiconductor containing at least one of Si, Ge, GaAs, C, and ZnO. Preferably, the distance from the first ferromagnetic layer 12A to the second ferromagnetic layer 12B is not longer than the spin-diffusion length of the channel layer 7.

Any of the first and second ferromagnetic layers 12A, 12B functions as an injecting electrode for injecting spins into the channel layer 7 or a receiving electrode for detecting the spins transmitted through the channel layer 7. The first ferromagnetic layer 12A is disposed on a first region 71 of the channel layer 7. The second ferromagnetic layer 12B is disposed on a second region 72 of the channel layer 7.

Each of the first and second ferromagnetic layers 12A, 12B has a rectangular parallelepiped form whose longer axis is oriented in the Y axis. The first and second ferromagnetic layers 12A, 12B may have the same width along the X axis. As illustrated in FIG. 1, the direction of magnetization G1 of the first ferromagnetic layer 12A may be the same as the direction of magnetization G2 of the second ferromagnetic layer 12B, for example. In this case, the magnetization of the first and second ferromagnetic layers 12A, 12B can be pinned easily.

The first and second ferromagnetic layers 12A, 12B are made of a ferromagnetic material. The first and second ferromagnetic layers 12A, 12B may be made of a metal selected from the group consisting of Cr, Mn, Co, Fe, and Ni, an alloy containing at least one element selected from the group, or a compound containing at least one element selected from the group and at least one element selected from the group consisting of B, C, N, Si, and Ge, for example.

The magnetic shield layer covers the surface of the channel layer 7 at least partly while interposing an insulating film (e.g., insulating films 7a, 7b) therebetween, thereby blocking external magnetic fields from entering the channel layer 7. For this purpose, the magnetic shield layer covers at least one of the upper, side, and lower faces of the channel layer 7 existing between the first and second regions 71, 72. In the example illustrated in FIG. 2, the magnetic shield layer is constituted by a lower magnetic shield layer S1 and an upper magnetic shield layer S2. The lower magnetic shield layer S1 is disposed under the channel layer 7. The upper magnetic shield layer S2 is disposed on the channel layer 7.

The magnetic shield layer has a through-hole H extending toward the channel layer 7. The through-hole H is used for applying an external magnetic field to the channel layer 7. In the example illustrated in FIG. 2, the through-hole H is formed in the upper magnetic shield layer S2 and arranged so as to oppose the upper face of the channel layer 7 in the part existing between the first and second regions 71, 72.

Preferably, as seen from the axial direction of the through-hole H (e.g., the Z axis in the example of FIG. 1), the whole cross section of the through-hole H opposes the channel layer 7. That is, the through-hole H is kept from extending off from the channel layer 7 as seen from the axial direction of the through-hole H. This makes it possible to read external magnetic fields more accurately.

Figure 4:
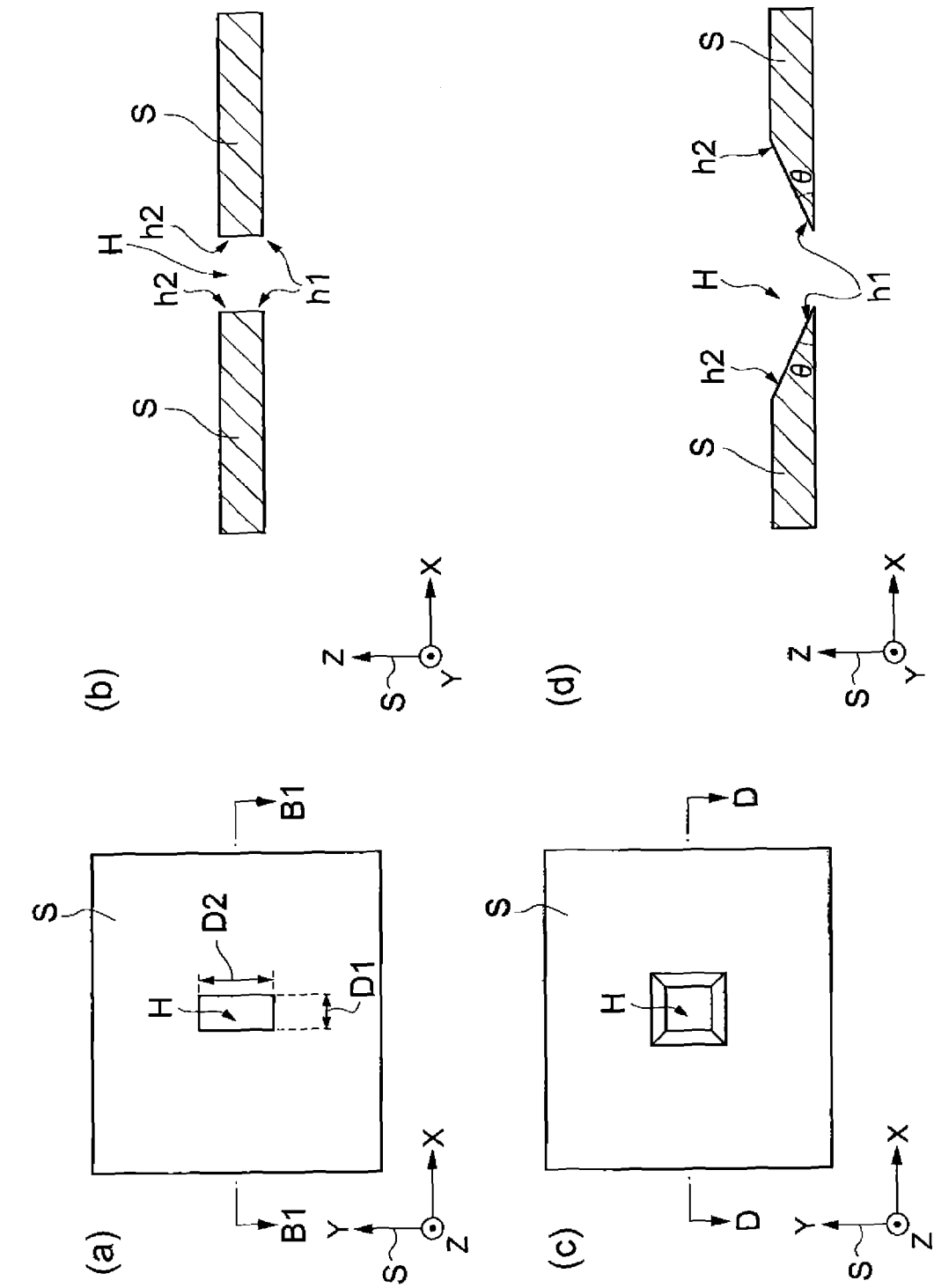
FIG. 4(a) is a top plan view illustrating an example of a through-hole formed in a magnetic shield layer.
FIG. 4(b) is a sectional view taken along the line B1-B1 of FIG. 4(a)
FIG. 4(c) is a top plan view illustrating an example of the through-hole formed in the magnetic shield layer.
FIG. 4(d) is a sectional view taken along the line D-D of FIG. 4(c)

FIG. 4(a) is a top plan view illustrating an example of the through-hole H formed in the magnetic shield layer S. As seen from the thickness direction of the magnetic shield layer S (the Z axis), the through-hole H can attain various forms, an example of which is a rectangle. In the example illustrated in FIG. 4(a), the through-hole H has an oblong form as seen from the thickness direction of the magnetic shield layer S (the Z axis). In this case, letting the shorter-side length (X-axis length) D1 of the through-hole H be 0.003 to 0.3 μm, for example, its longer-side length (Y-axis length) D2 may be 0.01 to 1 μm, for example.

FIG. 4(b) is a sectional view taken along the line B1-B1 of FIG. 4(a). As illustrated in FIG. 4(b), the bottom part h1 of the through-hole H may have a size identical to that of its top part h2. In this case, the through-hole H extends vertically toward the channel layer 7.

Examples of the material for the magnetic shield layer include soft magnetic materials such as alloys containing Ni and Fe, sendust, alloys containing Fe and Co, and alloys containing Fe, Co, and Ni.

The magnetic sensor 1 further comprises a first reference electrode 20A and a second reference electrode 20B. The first reference electrode 20A is disposed on a third region 73 of the channel layer 7. The second reference electrode 20B is disposed on a fourth region 74 of the channel layer 7. Preferably, the channel layer 7 extends from the first ferromagnetic layer 12A to the first reference electrode 20A in a direction different from the direction extending from the first ferromagnetic layer 12A to the second ferromagnetic layer 12B, and the channel layer 7 extends from the second ferromagnetic layer 12B to the second reference electrode 20B in a direction different from the direction extending from the second ferromagnetic layer 12B to the first ferromagnetic layer 12A. Each of the first and second reference electrodes 20A, 20B is made of an electrically conductive material, which is constituted by a nonmagnetic metal, such as Al, having a resistance lower than that of Si.

As illustrated in FIG. 2, the first and second regions 71, 72 exist between the third and fourth regions 73, 74. The first reference electrode 20A, first ferromagnetic layer 12A, second ferromagnetic layer 12B, and second reference electrode 20B are arranged in this order with predetermined gaps along the X axis on the channel layer 7.

The magnetic sensor 1 further comprises barrier layers 81A, 81B. The barrier layers 81A, 81B are disposed between the channel layer 7 and at least one of the first and second ferromagnetic layers 12A, 12B. This makes it possible for a large number of spin-polarized electrons to be injected from at least one of the first and second ferromagnetic layers 12A, 12B into the channel layer 7, whereby the potential output of the magnetic sensor can be enhanced. For example, the barrier layers 81A, 81B are tunnel barriers made of a film of an insulating material. Each of the barrier layers 81A, 81B is constituted by a single layer in the example illustrated in FIG. 2 but may have a multilayer structure constructed by a plurality of layers. For example, layers made of magnesium oxide, aluminum oxide, titanium oxide, zinc oxide, and beryllium oxide may be used as the barrier layers 81A, 81B. Preferably, from the viewpoint of making them function as a tunnel insulating layer by inhibiting the resistance from increasing, each of the barrier layers 81A, 81B has a thickness of 3 nm or less. Preferably, in view of one atomic layer thickness, each of the barrier layers 81A, 81B has a thickness of 0.4 nm or more.

The magnetic sensor 1 further comprises an insulating film (or insulator). The insulating film functions to prevent the channel layer 7 from being exposed and insulate the channel layer 7 electrically and magnetically. Preferably, the insulating film exists between the magnetic shield layer and the channel layer 7. This is effective in inhibiting the spin flow flowing through the channel layer 7 from flowing out to the magnetic shield layer in particular. Preferably, the insulating film covers a necessary region on a surface (e.g., a lower, side, or upper face) of the channel layer 7. In the example illustrated in FIG. 2, insulating films 7a, 7b are disposed on the lower and upper faces of the channel layer 7, respectively. Specifically, the insulating film 7b is arranged on the upper faces of regions existing between the first and second regions 71, 72, between the first and third regions 71, 73, and between the second and fourth regions 72, 74 in the channel layer 7. Leads connecting with the first reference electrode 20A, first ferromagnetic layer 12A, second ferromagnetic layer 12B, and second reference electrode 20B can be restrained from absorbing spins of the channel layer 7 when arranged on the insulating film 7b. When the leads are placed on the insulating film 7b, currents can also be kept from flowing from the leads to the channel layer 7.

When the insulating film exists, the lower magnetic shield layer S1 is disposed on the lower face of the channel layer 7 with the insulating film 7a interposed therebetween. The upper magnetic shield layer S2 is disposed on the upper face of the channel layer 7 with the insulating film 7b interposed therebetween.

An example of a method for manufacturing the magnetic sensor 1 in accordance with this embodiment will now be explained. First, alignment marks are formed on a substrate prepared beforehand. As a substrate, an AlTiC substrate may be used, for example. With reference to the alignment marks, the lower magnetic shield layer S1 is formed on the substrate. Subsequently, the insulating film 7a is formed on the lower magnetic shield layer S1 by molecular beam epitaxy (MBE), for example.

Next, the channel layer 7 is formed on the insulating film 7a by MBE, for example. Ions for rendering the channel layer 7 electrically conductive are injected therein, so as to adjust the conductive characteristic of the channel layer 7. Thereafter, the ions are diffused by thermal annealing when necessary. Subsequently, attached substances, organic matters, and oxide films are washed away from the surface of the channel layer 7. For example, a diluted HF solution is used as a washing liquid.

Thereafter, a barrier film to become the barrier layers 81A, 81B and a ferromagnetic film to become the first and second ferromagnetic layers 12A, 12B are formed in this order on the channel layer 7 by MBE, for example. Subsequently, the barrier film and ferromagnetic film are processed through a mask formed by an electron beam (EB) method, for example. This forms the first and second ferromagnetic layers 12A, 12B on the barrier layers 81A, 81B on the first and second regions 71, 72 of the channel layer 7, respectively. Antiferromagnetic layers may further be formed on the first and second ferromagnetic layers 12A, 12B by MBE, for example, when necessary. Then, annealing under a magnetic field is carried out in order to pin the direction of magnetization of the first or second ferromagnetic layer 12A, 12B. Thereafter, unnecessary barrier and ferromagnetic films formed on the channel layer 7 are removed by ion milling, for example.

Next, the insulating film 7b is formed on the channel layer 7 free of the unnecessary barrier and ferromagnetic films. Also, the insulating film 7b is removed from the third and fourth regions 73, 74 of the channel layer 7, and the first and second reference electrodes 20A, 20B are formed there, respectively. The first and second reference electrodes 20A, 20B are formed by Al, for example.

Also, the upper magnetic shield layer S2 is formed on the insulating film 7b disposed on the upper face of the region of the channel layer 7 existing between the first and second regions 71, 72. The upper magnetic shield layer S2 is provided with the through-hole H for magnetic fluxes from external magnetic fields to enter. The through-hole H can be formed by photolithography, for example. The foregoing method can produce the magnetic sensor 1 illustrated in FIGS. 1 and 2.

Figure 3:
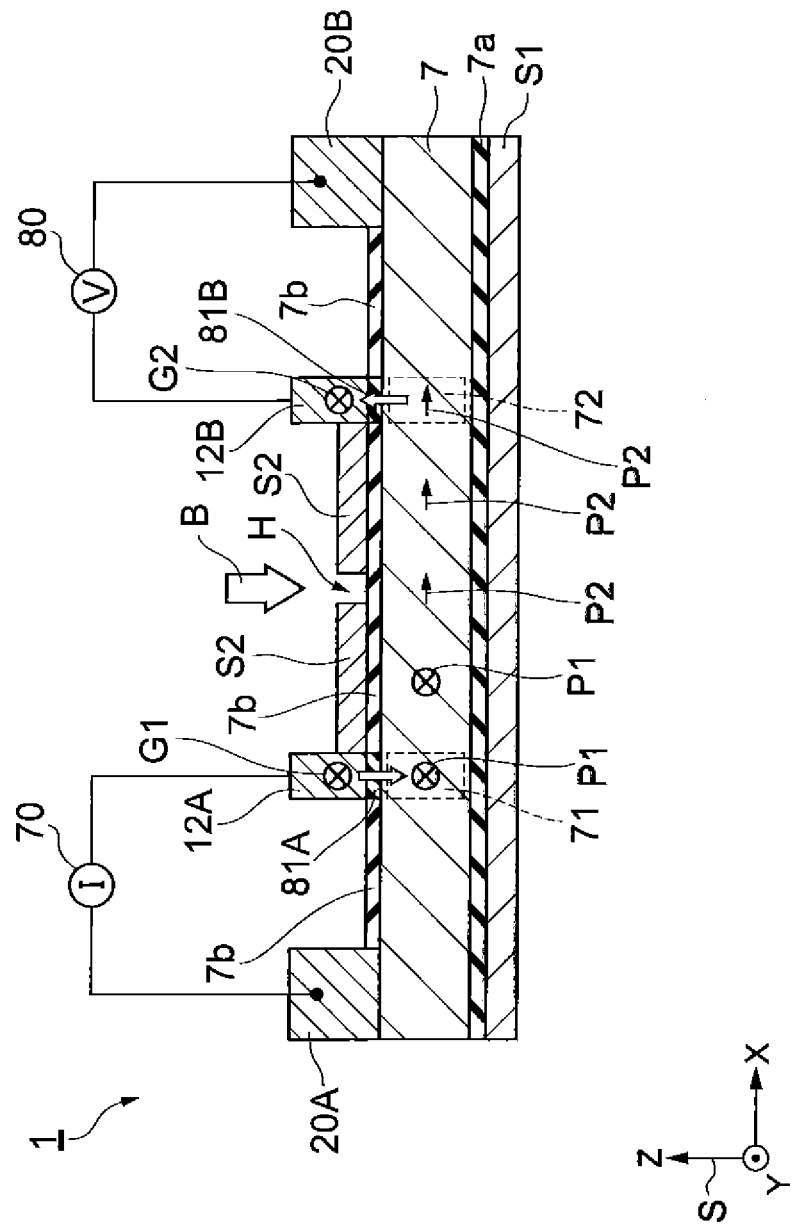
FIG. 3 is a side view for explaining effects of the magnetic sensor.

Operations and effects of the magnetic sensor 1 in accordance with this embodiment will now be explained. FIG. 3 is a side view for explaining operations of the magnetic sensor 1 in accordance with the first embodiment. To begin with, the directions of magnetization of the first and second ferromagnetic layers 12A, 12B are pinned. In the example illustrated in FIG. 3, the direction of magnetization G1 of the first ferromagnetic layer 12A is pinned to the same direction (the Y axis) as with the direction of magnetization G2 of the second ferromagnetic layer 12B.

For example, connecting the first ferromagnetic layer 12A and first reference electrode 20A to a current supply 70 can cause a detection current to flow through the first ferromagnetic layer 12A. When a current flows from the first ferromagnetic layer 12A, which is a ferromagnetic body, to the nonmagnetic channel layer 7 through the barrier layer 81A, electrons having spins P1 oriented in the direction corresponding to the direction of magnetization G1 of the first ferromagnetic layer 12A are injected into the channel layer 7. The injected spins P1 diffuse toward the second ferromagnetic layer 12B. Thus, a structure in which the current and spin flows through the channel layer 7 are mainly directed along the X axis can be obtained.

Figure 14:
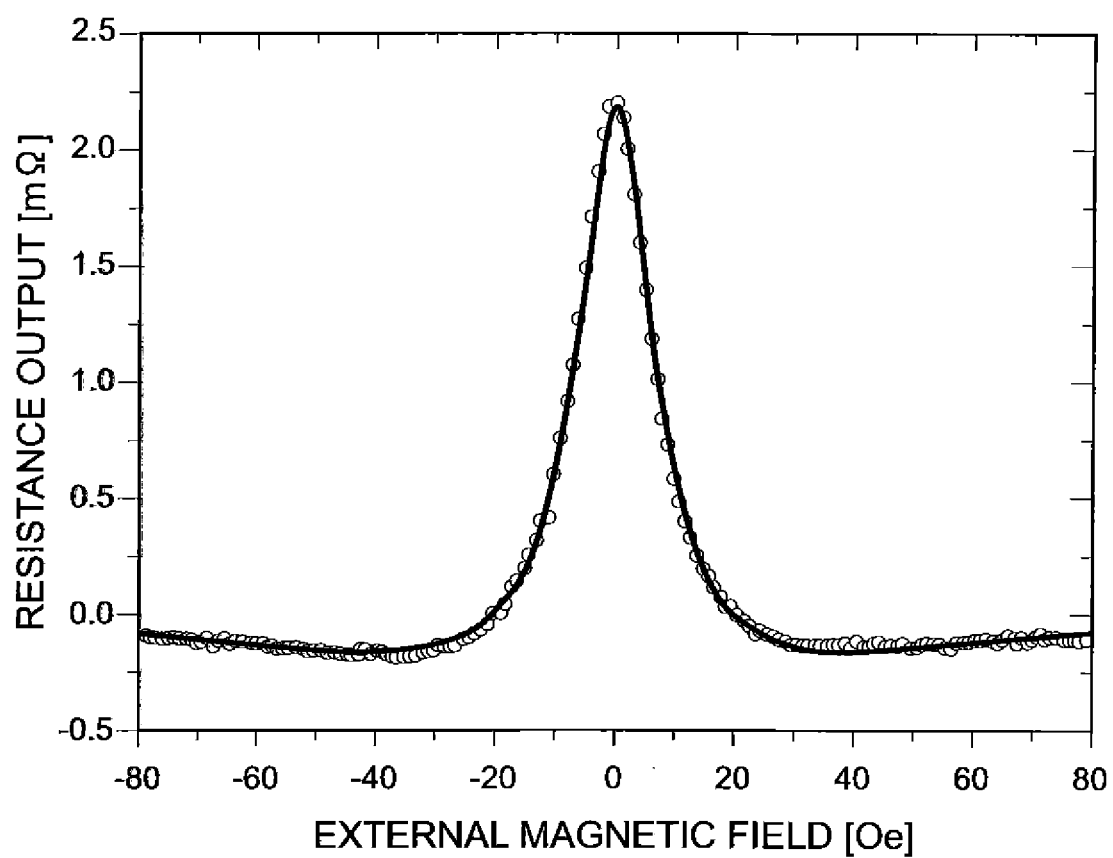
FIG. 14 is a graph illustrating the relationship between external magnetic field and resistance output.

FIG. 14 is a graph illustrating an example of the relationship between external magnetic field and resistance output. Here, when no external magnetic field B is applied to the channel layer 7, i.e., when the external magnetic field B is zero, directions of spins diffusing into the region between the first and second regions 71, 72 of the channel layer 7 do not rotate. Therefore, the spins oriented in the preset direction of magnetization G2 of the second ferromagnetic layer 12B diffuse to the second region 72. Hence, the resistance output or voltage output attains a local extreme value when the external magnetic field B is zero. The local extreme value may be a local maximum or local minimum depending on the direction of the current or magnetization. The output can be evaluated by an output, meter such as a voltmeter 80 connected to the second ferromagnetic layer 12B and second reference electrode 20B.

On the other hand, a case where the external magnetic field B is applied from the through-hole H to the channel layer 7 will now be considered. In the example of FIG. 3, the external magnetic field B is applied in a direction (the Z axis) perpendicular to the directions of magnetization G1, G2 of the first and second ferromagnetic layers 12A, 12B. When the external magnetic field B is applied, the direction of spins P2 diffusing through the region opposing the through-hole H within the channel layer 7 rotates about the axial direction of the external magnetic field B (the Z axis) (i.e., so-called Hanle effect). The relative angle between the direction of rotation of the spins P2 diffusing to the second region 72 of the channel layer 7 and the preset direction of magnetization G2, i.e., spin, of the second ferromagnetic layer 12B determines the voltage output and resistance output of the interface between the channel layer 7 and the second ferromagnetic layer 12B. When the external magnetic field B is applied, the direction of spins diffusing in the channel layer 7 rotates, thus failing to orient in the direction of magnetization G2 of the second ferromagnetic layer 12B. Therefore, the resistance output or voltage output becomes less than a local maximum when the external magnetic field B is applied in the case where the local maximum would be attained if the external magnetic field B were zero, and more than a local minimum when the external magnetic field B is applied in the case where the local minimum would be attained if the external magnetic field B were zero.

Hence, as illustrated in FIG. 14, the output peak appears when the external magnetic field B is zero, and the output decreases as the external magnetic field B is increased or decreased. That is, the output varies depending on whether there is the external magnetic field B or not, whereby the magnetic sensor 1 in accordance with this embodiment can be used as a magnetic detection device.

Thus, using the through-hole H formed in the magnetic shield layer, minute magnetic fluxes corresponding to the size of the through-hole H can be detected. Here, the resolution is determined by the size of the through-hole H, whereby magnetic fluxes can be detected from small areas without finely dividing the size of the first and second ferromagnetic layers 12A, 12B. Therefore, the device resistance can also be inhibited from being increased by finely dividing the first and second ferromagnetic layers 12A, 12B.

While conventional magnetic sensors utilizing spins exhibit output peaks according to relative angles between the directions of magnetization of free and pinned magnetization layers when they are parallel or antiparallel to each other, the magnetic sensor of the present invention yields the output peak when the external magnetic field is zero as mentioned above. When reading a positive/negative timing of the external magnetic field by employing the magnetic sensor of the present invention in a magnetic head or the like, for example, the output peak appears at a zero point where magnetic fields of a magnetic domain wall cancel each other out, whereby it can be determined that inversion has occurred there. The magnetic sensor of the present invention is also characterized by its lack of hysteresis as illustrated in FIG. 14.

The relationship between the output and the size of the through-hole H will now be explained additionally. FIG. 15 is a graph illustrating results of simulation representing differences in output intensity caused by differences in size of the through-hole H. FIG. 15 assumes a case where the through-hole H is square. FIG. 15(a) illustrates an example in which one side of the square through-hole H is 0.01 μm. FIG. 15(b) illustrates an example in which one side of the square through-hole H is 0.1 μm. FIG. 15(c) illustrates an example in which one side of the square through-hole H is 1 μm. FIG. 15(d) illustrates an example in which one side of the square through-hole H is 10 μm. Assumed here is a case where the channel layer 7 is made of Si, while its ion content for providing electrical conductivity is $1\times10^{20}$ $cm^{-3}$. The spin-diffusion length of Si is about 2.5 μm. Hence, the simulation results of FIG. 15 show that the output waveform and output intensity hardly vary when one side of the square through-hole H is smaller than the spin-diffusion length.

Though a preferred embodiment of the present invention has been explained in detail in the foregoing, the present invention is not limited thereto. For example, the through-hole H is not restricted to the form mentioned above. FIG. 4(c) is a top plan view illustrating a mode of the through-hole in the magnetic shield layer S. FIG. 4(d) is a sectional view taken along the line D-D of FIG. 4(c). As illustrated in FIG. 4(c), the bottom part h1 of the through-hole H may have a diameter smaller than that of the top part h2 of the through-hole H. That is, the through-hole H may have a tapered side face. In this case, magnetic fluxes caused by the external magnetic field B cannot be absorbed by the magnetic shield layer S when obliquely incident on the upper face of the channel layer 7. Therefore, the angle of incidence of the external magnetic field B can be changed according to the taper angle θ.

Figure 5:
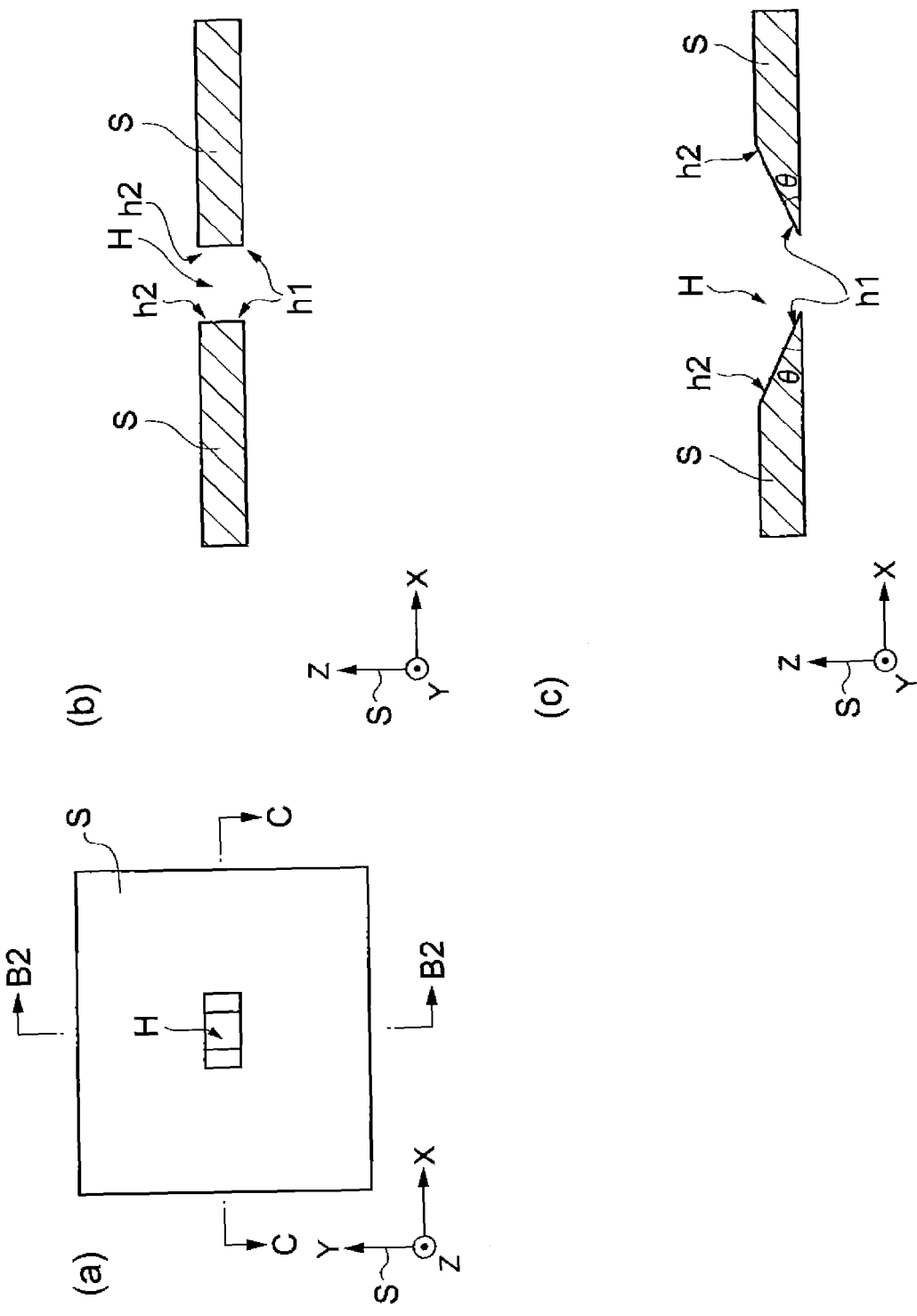
FIG. 5(a) is a top plan view illustrating an example of the through-hole formed in the magnetic shield layer.
FIG. 5(b) is a sectional view taken along the line B2-B2 of FIG. 5(a)
FIG. 5(c) is a sectional view taken along the line C-C of FIG. 5(a)

FIG. 5(a) is a top plan view illustrating a mode of the through-hole in the magnetic shield layer S. FIG. 5(b) is a sectional view taken along the line B2-B2 of FIG. 5(a). FIG. 5(c) is a sectional view taken along the line C-C of FIG. 5(a). As illustrated in FIG. 5(a), when the through-hole H has a rectangular form as seen from the thickness direction of the magnetic shield layer S, its shorter sides may be provided with tapered side faces while keeping the longer sides free of tapered side faces. That is, as illustrated in FIG. 5(b), the bottom part h1 may have the same diameter as with the top part h2 in the longer-side direction of the through-hole H. In the shorter-side direction of the through-hole H, on the other hand, the bottom part h1 of the through-hole H may have a diameter smaller than that of the top part h2 of the through-hole H as illustrated in FIG. 5(c). This can also change the angle of incidence of the external magnetic field B according to the taper angle θ.

Figure 6:
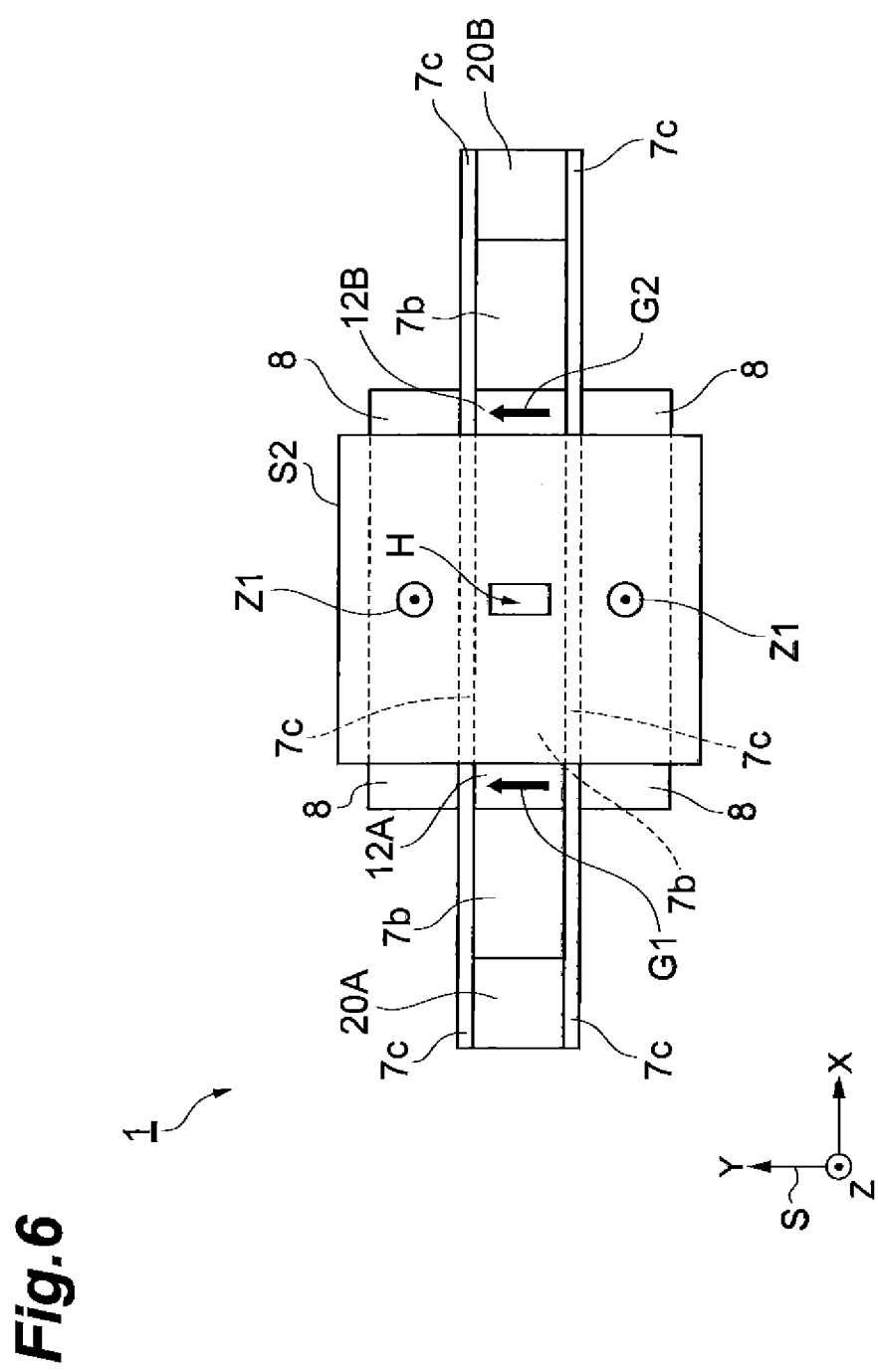
FIG. 6 is a top plan view illustrating an example of the magnetic sensor equipped with a permanent magnet.

Preferably, the magnetic sensor further comprises a permanent magnet for supplying the through-hole H with a magnetic field oriented in the axial direction of the through-hole H. FIG. 6 is a top plan view illustrating an example in which the magnetic sensor is equipped with a permanent magnet. The magnetic sensor 1 illustrated in FIG. 6 further comprises a permanent magnet 8 on insulating films 7c formed on side faces of the channel layer 7. Preferably, the permanent magnet 8 supplies the through-hole H with a magnetic field Z1 oriented in the axial direction of the through-hole H (the Z axis in the example of FIG. 6). While an output peak appears when the external magnetic field B to be detected is zero in the case where no magnetic field is applied to the channel layer 7 by the permanent magnet 8, the output peak can be issued when the external magnetic field B is not zero by applying a magnetic field to the channel layer 7 with the permanent magnet 8.

Figure 7:
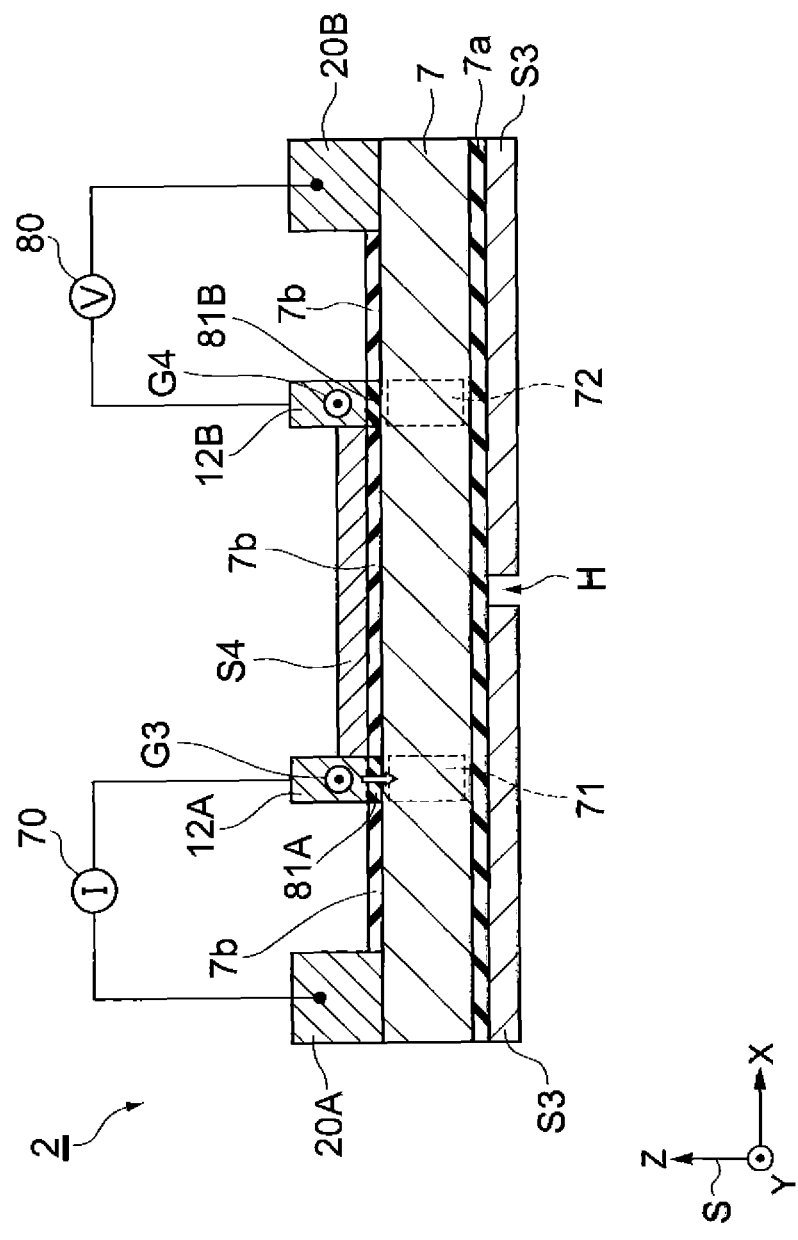
FIG. 7 is a side view illustrating Modified Example 1 of the magnetic sensor.

It will be sufficient if the through-hole H is provided in a magnetic shield layer covering the channel layer 7, e.g., lower magnetic shield layer. FIG. 7 is a side view illustrating Modified Example 1 of the magnetic sensor. In the magnetic sensor 2 illustrated in FIG. 7, the through-hole H is formed in a lower magnetic shield layer S3. The through-hole H is arranged such as to oppose the lower face of the channel layer 7 existing between the first and second regions 71, 72. That is, when the lower magnetic shield layer S3 is formed with the through-hole H, no through-holes are formed in the magnetic shield layers disposed on the upper and side faces of the channel layer. As a consequence, the external magnetic field can be read from the lower face of the channel layer 7.

Figure 8:
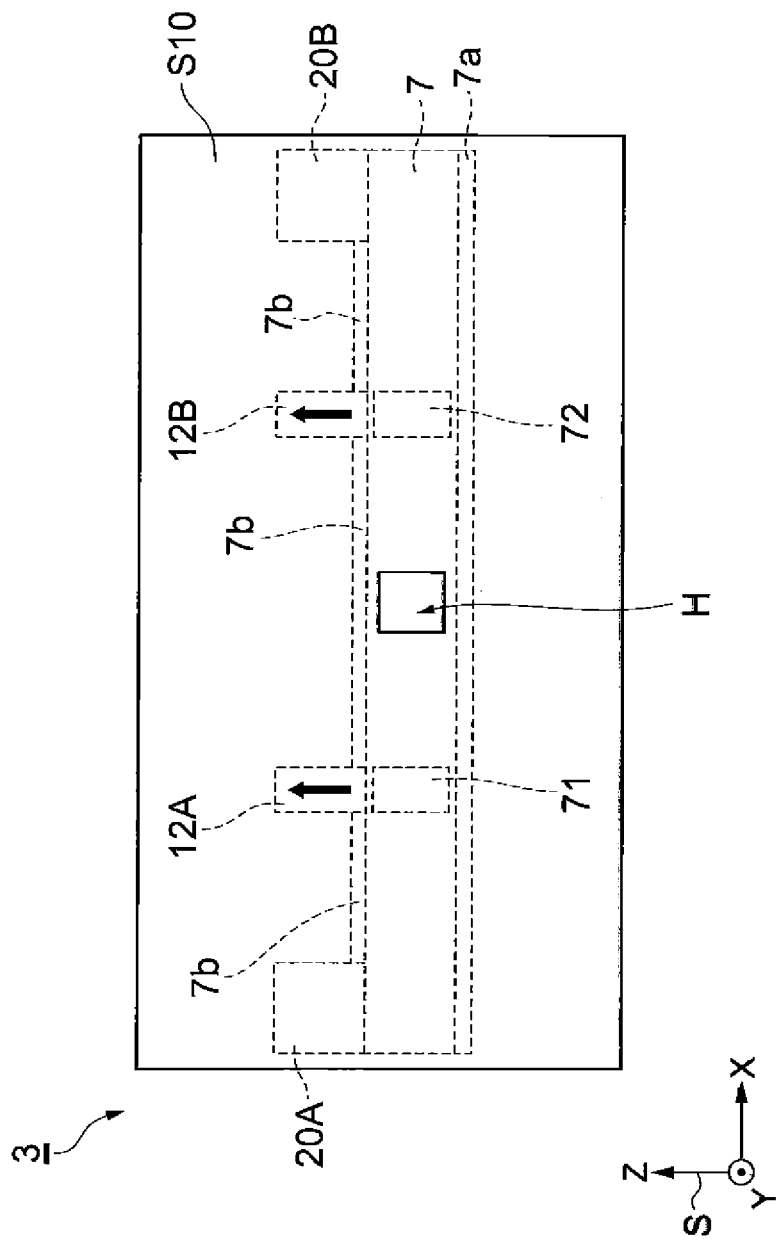
FIG. 8 is a side view illustrating Modified Example 2 of the magnetic sensor.

The through-hole H may be formed in a side magnetic shield layer. FIG. 8 is a side view illustrating Modified Example 2 of the magnetic sensor. In the magnetic sensor 3 illustrated in FIG. 8, the through-hole H is formed in a side magnetic shield layer S10 and detects external magnetic fields along the Y axis. The through-hole H is arranged such as to oppose a side face of the channel layer 7 existing between the first and second regions 71, 72. That is, when the through-hole H is formed in the side magnetic shield layer S10, no through-hole is formed in the upper and lower magnetic shield layers. As a consequence, external magnetic fields can be read from the side face of the channel layer 7.

Figure 9:
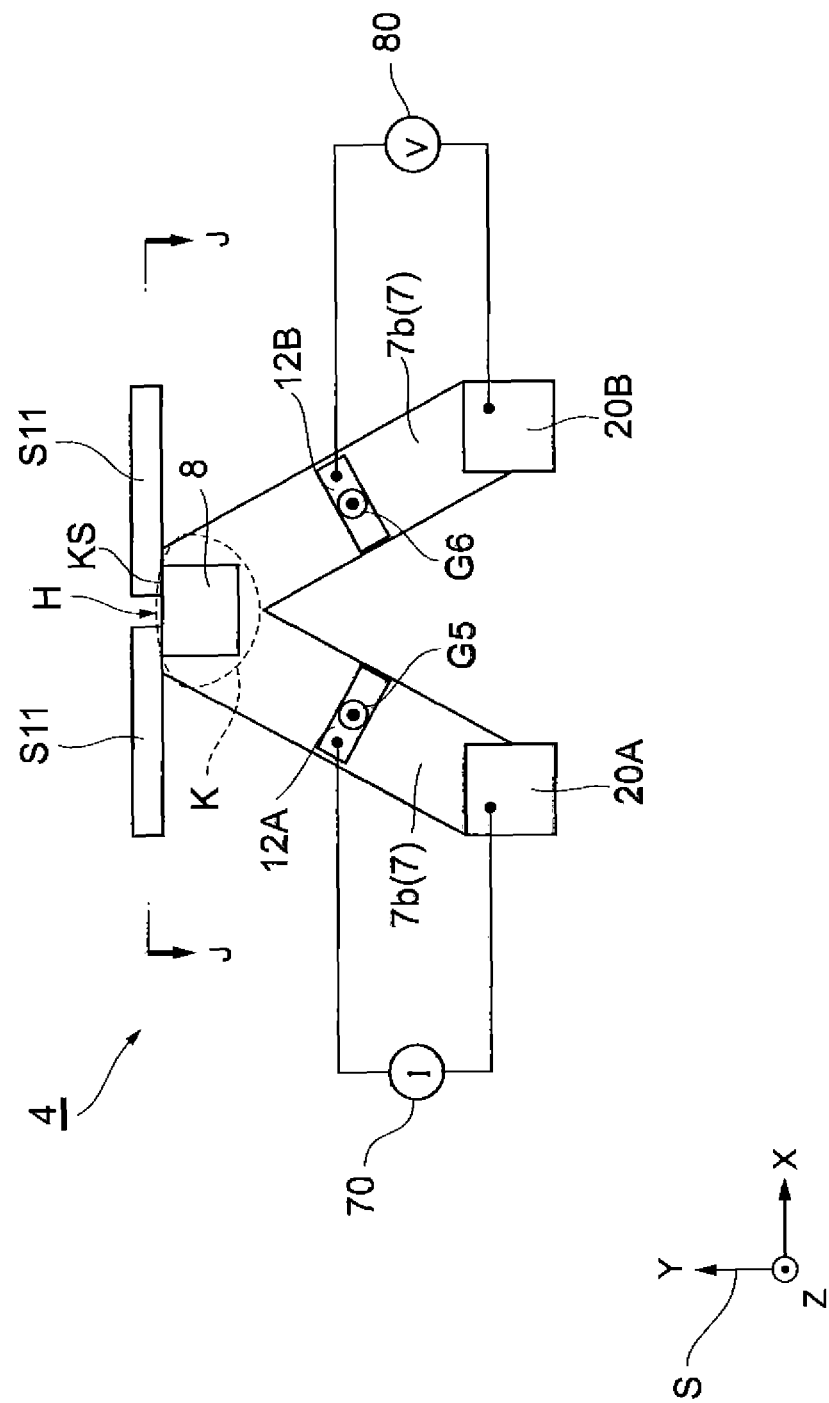
FIG. 9 is a top plan view illustrating Modified Example 3 of the magnetic sensor.
Figure 10:
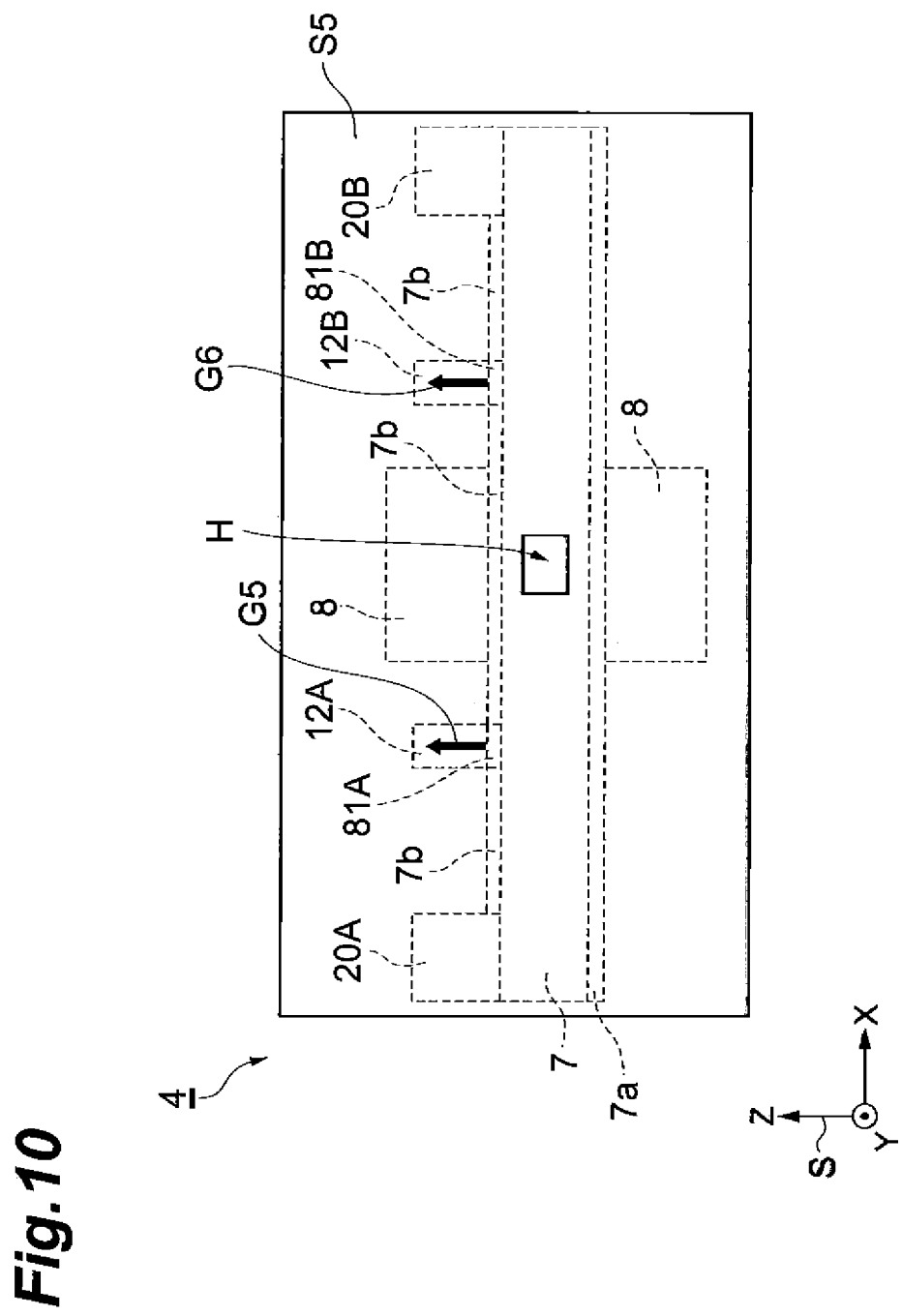
FIG. 10 is a side view illustrating a cross section taken along the line J-J of FIG. 9.

The channel layer 7 may have a form other than rectangles when seen from the thickness direction (the Z axis). FIG. 9 is a top plan view illustrating Modified Example 3 of the magnetic sensor. FIG. 10 is a side view illustrating a cross section taken along the line J-J of FIG. 9. The magnetic sensor 4 illustrated in FIG. 9 detects external magnetic fields along the Y axis. In this magnetic sensor 4, the channel layer 7 has a bent form as seen from the thickness direction of the channel layer 7. The channel layer 7 is disposed under the insulating film 7b and thus is not depicted in FIG. 9. In this case, the through-hole H is arranged such as to oppose an outer side face KS of a bend K of the channel layer 7 having the bent form. In the example illustrated in FIGS. 9 and 10, the through-hole H is provided in a side magnetic shield layer S11 formed on a side face of the channel layer 7. Thus bending the channel layer 7 and arranging the through-hole H such as to make it oppose the outer side face KS of the bend K allows a region for reading magnetic fluxes of the external magnetic field B and the like to be made compact.

Preferably, as illustrated in FIG. 9, the outer side face KS of the bend K of the channel layer 7 is made flat, and the side magnetic shield layer S11 is formed along the outer side face KS. In this case, the surface for reading external magnetic fields is flat, so that magnetic fields can easily be detected when the outer side face KS opposes a surface to be read of a recording medium, for example. FIGS. 9 and 10 illustrate an example in which the direction of magnetization G5 of the first ferromagnetic layer 12A is pinned to the same direction (the Z axis) as with the direction of magnetization G6 of the second ferromagnetic layer 12B. The permanent magnet 8 may further be arranged such as to oppose the upper and lower faces of the bend K of the channel layer 7, thereby feeding the through-hole H with a magnetic field oriented in the Y axis.

Figure 11:
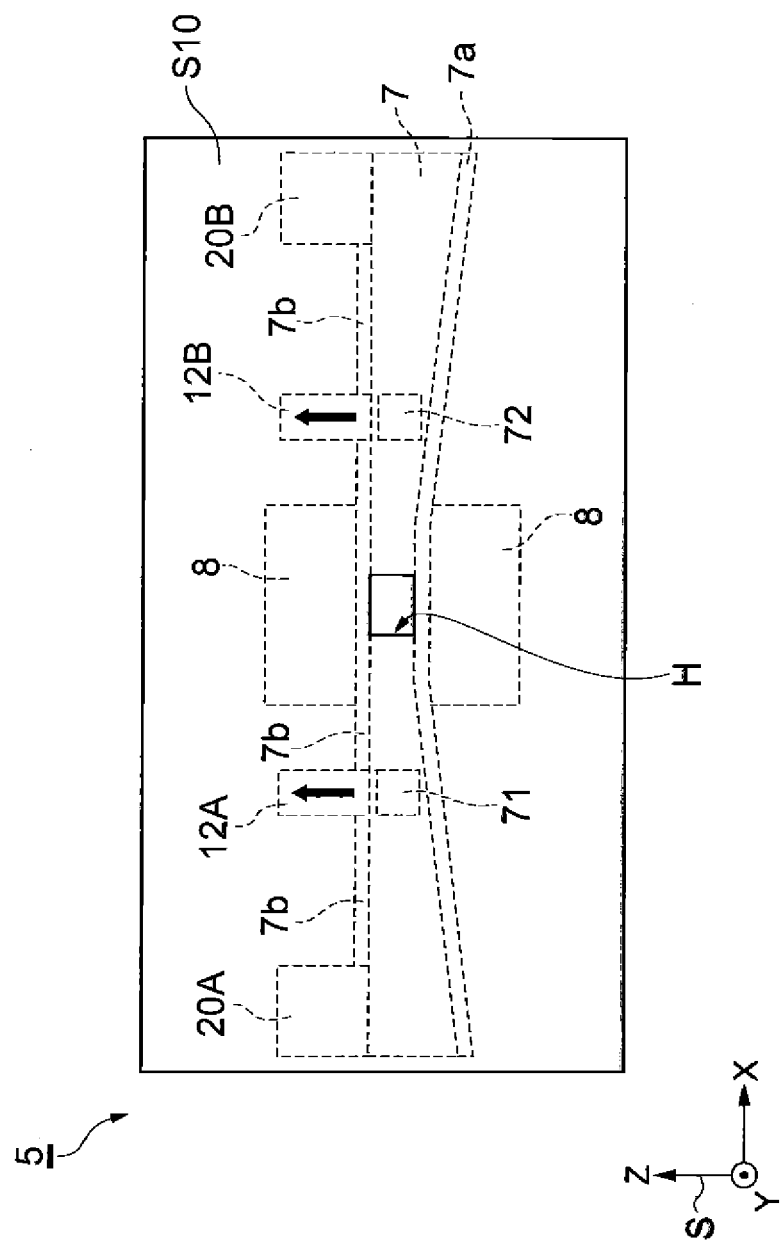
FIG. 11 is a side view illustrating Modified Example 4 of the magnetic sensor.

A part of the channel layer 7 at a position opposing the through-hole H may have a narrowed form. FIG. 11 is a side face illustrating Modified Example 4 of the magnetic sensor. In the magnetic sensor 5 illustrated in FIG. 11, the through-hole H is formed in a side magnetic shield layer S10. Preferably, a part located on the through-hole H side of the channel layer 7 has a width narrower than that of each of respective parts on the first ferromagnetic layer 12A side and the second ferromagnetic layer 12B side of the channel layer 7. That is, it will be preferred if the cross-sectional area of a plane (the YZ plane in the example of FIG. 11) perpendicular to the spin transmitting direction (the X axis in the example of FIG. 11) in the channel layer 7 is smaller in the part located on the through-hole H side than in at least one of the part located on the first ferromagnetic layer 12A side and the part located on the second ferromagnetic layer 12B side. When the part of the channel layer 7 located at the through-hole H has a narrowed form as such, spin flows diffusing into the channel layer 7 can be concentrated at this narrow part. Therefore, the external magnetic field B can effectively be applied to the concentrated spins through the through-hole H. Hence, the output sensitivity of magnetic fields can be improved.

Though FIG. 11 illustrates an example in which the through-hole H is formed in the side magnetic shield layer S10 while the part of the channel layer 7 located at a position opposing the through-hole H has a narrowed form, the through-hole H may be formed in the upper or lower magnetic shield layer as illustrated in FIG. 1 or 7, for example, while the part of the channel layer located at a position opposing the through-hole has a narrowed form. Though FIG. 11 illustrates an example in which only the lower face of the channel layer 7 is sloped, at least one of the upper, lower, and side faces of the channel layer 7 may be a slope. For example, a plurality of surfaces of the channel layer 7 may be sloped.

Figure 12:
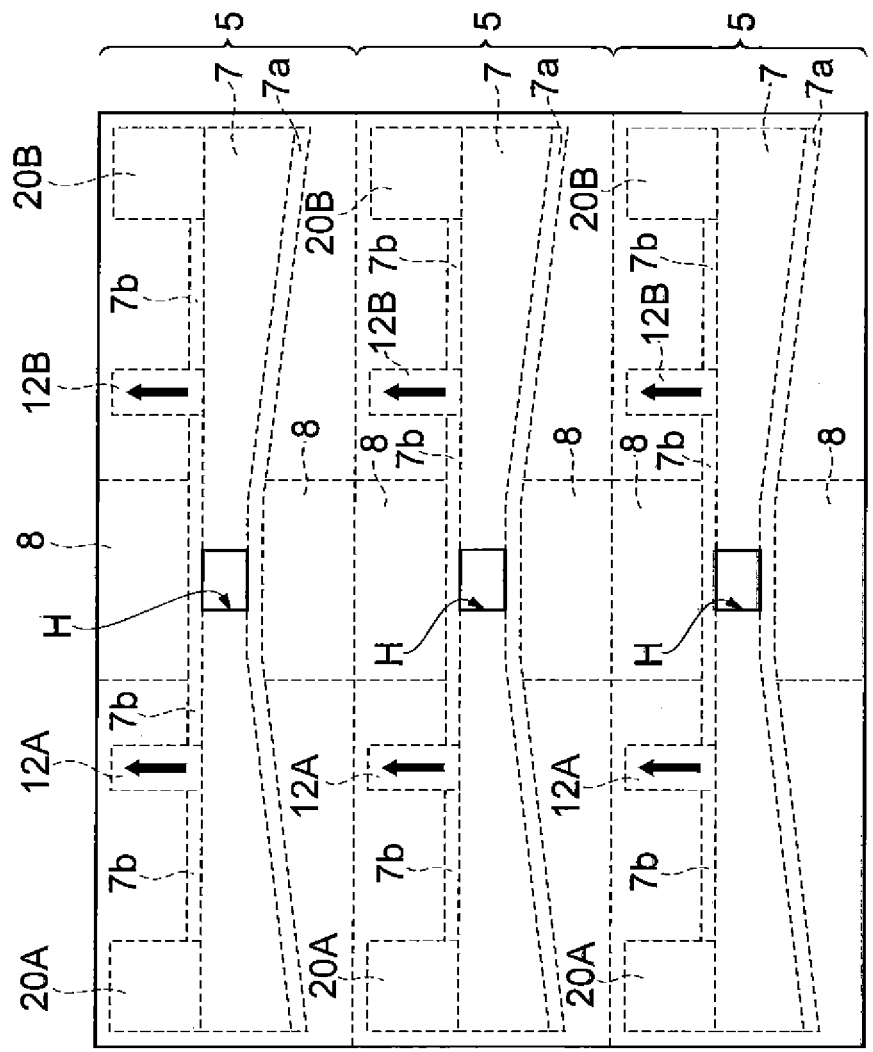
FIG. 12 is a side view illustrating Modified Example 5 of the magnetic sensor.

A magnetic detector may comprise a plurality of such magnetic sensors. In this case, respective outputs of the magnetic sensors can be combined. Such a magnetic detector can be employed in a biosensor for detecting cancer cells and the like, for example. For instance, a plurality of such magnetic sensors may be arranged in parallel or laminated, so as to form a magnetic detector. FIG. 12 is a side view illustrating Modified Example 5 of the magnetic sensor. As an example, FIG. 12 illustrates a structure in which a plurality of magnetic sensors 5 each depicted in FIG. 11 are laminated.

Figure 13:
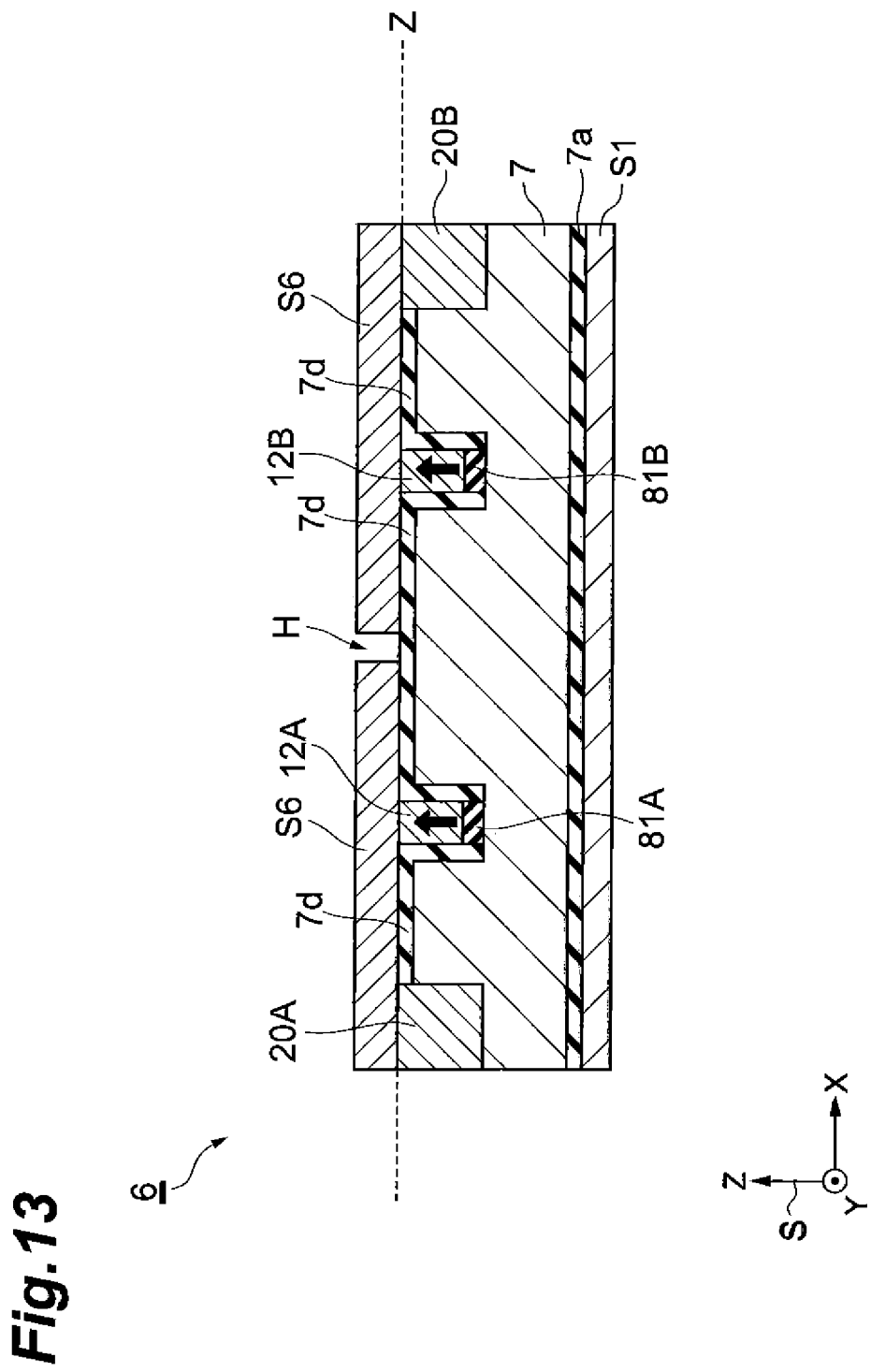
FIG. 13 is a side view illustrating Modified Example 6 of the magnetic sensor.

The foregoing illustrates an example in which the first and second ferromagnetic layers 12A, 12B, which are disposed on the barrier layers 81A, 81B, and the first and second reference electrodes 20A, 20B are formed such as to project from the upper face of the channel layer 7. However, the first and second ferromagnetic layers 12A, 12B and the first and second reference electrodes 20A, 20B may be embedded in the channel layer 7. FIG. 13 is a side view illustrating Modified Example 6 of the magnetic sensor. In the magnetic sensor 6 illustrated in FIG. 13, for example, the first and second ferromagnetic layers 12A, 12B are embedded in the channel layer 7 together with the barrier layers 81A, 81B. The upper faces of the first and second ferromagnetic layers 12A, 12B, the upper face of an insulating film 7d, and the upper faces of the first and second reference electrodes 20A, 20B form a flat surface Z. Preferably, the upper magnetic shield layer S6 provided with the through-hole H covers the flat surface Z. In the example of FIG. 13, the insulating film 7d covers the upper face of the channel layer 7 and enters between the channel layer 7 and side faces of the first ferromagnetic layer 12A and between the channel layer 7 and side faces of the second ferromagnetic layer 12B. The upper magnetic shield layer S6 is formed on the channel layer 7 with the insulating film 7d interposed therebetween. The first and second reference electrodes 20A, 20B may be kept from being embedded in the channel layer 7.

The upper magnetic shield layer S6 provided with the through-hole H covers the flat surface Z flattening the upper faces of the first ferromagnetic layer 12A, second ferromagnetic layer 12B, and insulating film 7d as such and thus can be arranged parallel to a magnetic field forming surface of a recording medium and the like. Therefore, magnetic fields can be read smoothly.

Preferably, the magnetic field pinning the direction of magnetization of the first or second ferromagnetic layer 12A, 12B is greater than the external magnetic field B to be evaluated. In this case, the external magnetic field B can be detected stably.

The magnetic sensor of the present invention can be employed in a reading head part in a magnetic head equipped with a recording head part for writing, for example. This makes it possible to provide a magnetic head which can detect magnetic fluxes from minute areas of recording media and the like, for example.

Resistance also varies between the first and second ferromagnetic layers 12A, 12B because of the magnetoresistive effect occurring depending on whether the external magnetic field B is applied or not. Therefore, providing a power supply between the first and second ferromagnetic layers 12A, 12B without the first and second reference electrodes 20A, 20B and monitoring changes in current or voltage also makes it possible to detect the external magnetic field B.

The current supply 70 and the output meter (e.g., voltmeter 80) may exchange their places. That is, the first ferromagnetic layer 12A and first reference electrode 20A may be connected to the output meter, while making the second ferromagnetic layer 12B and second reference electrode 20B connect with the current supply 70. In this case, the first and second ferromagnetic layers 12A, 12B function as receiving and injecting electrodes, respectively.

The foregoing illustrates an example in which the barrier layers 81A, 81B are tunnel barriers made of an insulating film. However, the barrier layers 81A, 81B may be tunnel barriers made of metal films. In this case, they may constitute Schottky barriers between the semiconductor channel layer 7 and the metal barrier layers 81A, 81B.

At least one of directions of magnetization of the first and second ferromagnetic layers 12A, 12B may be pinned by at least one of an antiferromagnetic body disposed on at least one of the first and second ferromagnetic layers 12A, 12B and shape anisotropy. For example, respective reversed magnetic fields of the first and second ferromagnetic layers 12A, 12B may be made different from each other by changing their aspect ratios in the X and Y axes. Alternatively, an antiferromagnetic layer for pinning the direction of magnetization may be disposed on at least one of the first and second ferromagnetic layers 12A, 12B. This can yield the first or second ferromagnetic layer 12A, 12B having a higher coercive force in one direction than when no antiferromagnetic layer is provided.

While the foregoing illustrates an example in which the directions of magnetization of the first and second ferromagnetic layers 12A, 12B are pinned to the same direction, it will be preferred if the axial direction of the through-hole H (the Z axis in the example of FIG. 1) is nonparallel to the directions of magnetization of the first and second ferromagnetic layers 12A, 12B. As mentioned above, when the external magnetic field B is applied to the channel layer 7, the direction of spins within the channel layer 7 rotates about the axis of the applied magnetic field. If the axial direction of the through-hole is parallel to the directions of magnetization of the first and second ferromagnetic layers, no rotation will occur in the direction of spins in response to the external magnetic field applied no matter from which ferromagnetic layer the spins are injected, thus making it hard to detect magnetic fluxes. Hence, such magnetic fluxes can be detected favorably when the axial direction of the through-hole is nonparallel to the directions of magnetization of the first and second ferromagnetic layers.

Therefore, the direction of magnetization of the first ferromagnetic layer 12A may be different from that of the second ferromagnetic layer 12B, e.g., in a direction opposite thereto. In this case, the output peak in the evaluation of the external magnetic field has a polarity opposite to that of the output peak in the case where the first and second ferromagnetic layers 12A, 12B have the same direction of magnetization. The directions of magnetization of the first and second ferromagnetic layers 12A, 12B may be parallel to their surfaces opposing the channel layer 7 as in FIG. 1 or perpendicular thereto as in FIGS. 8 and 9.

Since the half width of the peak of voltage output or resistance output with respect to the external magnetic field is in proportion to the reciprocal of the spin life in the channel layer 7, the magnetic field sensitivity becomes better as the spin life is longer. Examples of materials having a long spin life usable in the channel layer 7 include Si and GaAs, in which Si is preferred in particular. Though the magnetic field sensitivity becomes inferior, a wider range of magnetic fields can be detected when the spin life in the channel layer 7 is shorter.

While the foregoing is explained with reference to examples in which the channel layer 7, first ferromagnetic layer 12A, second ferromagnetic layer 12B, and magnetic shield layer are so-called layers, the present invention is not limited thereto. Various modes of channels, first ferromagnetic bodies, second ferromagnetic bodies, and magnetic shields can replace the channel layer 7, first ferromagnetic layer 12A, second ferromagnetic layer 12B, and magnetic shield layer as long as they are usable as constituents for the above-mentioned magnetic sensor. In this case, each of the channel, first ferromagnetic body, second ferromagnetic body, and magnetic shield may be made spherical or circular cylindrical, for example.

REFERENCE SIGNS LIST 1, 2, 3, 4, 5, 6 . . . magnetic sensor; 7 . . . channel layer; 7a, 7b, 7c, 7d . . . insulating film; 8 . . . permanent magnet; 12A . . . first ferromagnetic layer; 12B . . . second ferromagnetic layer; 20A . . . first reference electrode; 20B . . . second reference electrode; S1, S3 . . . lower magnetic shield layer; S2 . . . upper magnetic shield layer; S10, S11 . . . side magnetic shield layer; H . . . through-hole; 81A . . . barrier layer; 81B . . . barrier layer; K . . . bend

What is claimed is:

1. A magnetic sensor comprising:
    a first ferromagnetic body;
    a second ferromagnetic body separate from the first ferromagnetic body;
    a channel extending from the first ferromagnetic body to the second ferromagnetic body;
    a magnetic shield that covers the channel and that is separate from the first and the second ferromagnetic bodies; and
    an insulating film disposed between the channel and the magnetic shield;
    wherein the magnetic shield has a through-hole extending toward the channel; and
    wherein an axial direction of the through-hole is nonparallel to a direction of net magnetization of at least one of the first and second ferromagnetic bodies.

2. A magnetic sensor according to claim 1, wherein the through-hole has a whole cross section opposing the channel as seen from the axial direction of the through-hole.

3. A magnetic sensor according to claim 1, wherein the through-hole has a bottom part having a diameter smaller than that of a top part thereof.

4. A magnetic sensor according to claim 1, wherein the channel has a bent form; and
    wherein the through-hole is disposed so as to oppose an outer side face of a bend of the channel.

5. A magnetic sensor according to claim 1, wherein the first and second ferromagnetic bodies are embedded in the channel, upper faces of the first and second ferromagnetic bodies and an upper face of the insulating film forming a flat surface; and
    wherein the magnetic shield provided with the through-hole covers the flat surface.

6. A magnetic sensor according to claim 1, wherein a part located on the through-hole side of the channel has a width narrower than that of each of respective parts located on the first ferromagnetic body side and second ferromagnetic body side of the channel.

7. A magnetic sensor according to claim 1, wherein the direction of net magnetization of at least one of the first and second ferromagnetic bodies is pinned by at least one of an antiferromagnetic body and shape anisotropy.

8. A magnetic sensor according to claim 1, wherein the direction of net magnetization of the first ferromagnetic body is the same as that of the second ferromagnetic body.

9. A magnetic sensor according to claim 1, further comprising a permanent magnet configured to supply the through-hole with a magnetic field oriented in the axial direction of the through-hole.

10. A magnetic sensor according to claim 1, wherein the first and second ferromagnetic bodies are made of (1) a metal selected from the group consisting of Cr, Mn, Co, Fe, and Ni; (2) an alloy containing at least one element selected from the group; or (3) a compound containing at least one element selected from the group and at least one element selected from the group consisting of B, C, N, Si, and Ge.

11. A magnetic sensor according to claim 1, wherein the channel is made of a semiconductor containing at least one of Si, Ge, GaAs, C, and ZnO.

12. A magnetic sensor according to claim 1, wherein a barrier layer is formed between at least one of the first and second ferromagnetic bodies and the channel.

13. A magnetic sensor according to claim 1, further comprising a first reference electrode of non-magnetic metal and a second reference electrode of non-magnetic metal that is separate from the first reference electrode;
wherein the channel extends from the first ferromagnetic body to the first reference electrode in a direction different from a direction extending from the first ferromagnetic body to the second ferromagnetic body;
wherein the channel extends from the second ferromagnetic body to the second reference electrode in a direction different from a direction extending from the second ferromagnetic body to the first ferromagnetic body;
wherein a current flows between the first reference electrode and the first ferromagnetic body; and
wherein a voltage is measured between the second reference electrode and the second ferromagnetic body.

14. A magnetic sensor according to claim 13, further comprising a current supply and an output meter;
wherein the current supply is electrically connected to the first ferromagnetic body and the first reference electrode; and
wherein the output meter is electrically connected to the second ferromagnetic body and the second reference electrode.

15. A magnetic sensor according to claim 1, further comprising a power supply disposed between the first and second ferromagnetic bodies.

16. A magnetic detector comprising a plurality of magnetic sensors according to claim 1.

17. A magnetic head comprising a reading head part having the magnetic sensor according to claim 1 and a recording head part for writing.

18. A magnetic sensor according to claim 1, wherein the magnetic shield has a material composition different than that of the first and second ferromagnetic bodies.

19. A magnetic sensor according to claim 18, wherein the axial direction of the through-hole is nonparallel to the direction of net magnetization of the first ferromagnetic body and to the direction of net magnetization of the second ferromagnetic body.

20. A magnetic sensor according to claim 19,
wherein the magnetic shield is disposed between the first ferromagnetic body and the second ferromagnetic body.

21. A magnetic sensor according to claim 1, wherein the magnetic shield and the channel are electrically insulated.

* * * * *